(12) United States Patent
Hsieh (10) Patent No.: US 12,040,292 B2
(45) Date of Patent: Jul. 16, 2024

(54) METHOD FOR FORMING CONDUCTIVE LAYER, AND CONDUCTIVE STRUCTURE AND FORMING METHOD THEREFOR

(71) Applicant: CHANGXIN MEMORY TECHNOLOGIES, INC., Anhui (CN)

(72) Inventor: Ming-Teng Hsieh, Anhui (CN)

(73) Assignee: CHANGXIN MEMORY TECHNOLOGIES, INC., Helei (CN)

( * ) Notice: Subject to any disclaimer, the term of this patent is extended or adjusted under 35 U.S.C. 154(b) by 383 days.

(21) Appl. No.: 17/448,664

(22) Filed: Sep. 23, 2021

(65) Prior Publication Data

US 2022/0013479 A1  Jan. 13, 2022

Related U.S. Application Data (63) Continuation of application No. PCT/CN2021/104305, filed on Jul. 2, 2021.

(30) Foreign Application Priority Data

Jul. 2, 2020  (CN) .......................... 202010633735.3

(51) Int. Cl.
*H01L 23/00* (2006.01)
*H01L 21/66* (2006.01)

(52) U.S. Cl.
CPC .............. *H01L 24/03* (2013.01); *H01L 22/32* (2013.01); *H01L 24/05* (2013.01); *H01L 24/11* (2013.01);
(Continued)

(58) Field of Classification Search
CPC ......... H01L 24/03; H01L 24/05; H01L 24/11; H01L 24/13; H01L 24/14; H01L 22/32;
(Continued)

(56) References Cited

U.S. PATENT DOCUMENTS 1,843,635 A   2/1932 Taylor
7,213,322 B2  5/2007 Nakagawara
(Continued)

FOREIGN PATENT DOCUMENTS

CN   1543062 A   11/2004
CN   102623080 A   8/2012
(Continued)

OTHER PUBLICATIONS

International Search Report in the international application No. PCT/CN2021/104305, mailed on Sep. 28, 2021.

*Primary Examiner* — Alonzo Chambliss
(74) *Attorney, Agent, or Firm* — Syncoda LLC; Feng Ma (57) ABSTRACT

A method for forming the conductive layer includes: providing a first conductive film and a solution with a conductive material; coating a surface of the first conductive film with the solution, before performing the coating, a temperature of the first conductive film being lower than an evaporation temperature or a sublimation temperature of the solution; and in a process step of performing the coating or after performing the coating, heating the first conductive film, such that the temperature of the first conductive film is higher than or equal to the evaporation temperature or the sublimation temperature of the solution, and forming a second conductive film covering the surface of the first conductive film, wherein the second conductive film including the conductive material.

15 Claims, 11 Drawing Sheets

(52) U.S. Cl.
CPC .... *H01L 24/13* (2013.01); *H01L 2224/03921* (2013.01); *H01L 2224/0401* (2013.01); *H01L 2224/04042* (2013.01); *H01L 2224/05073* (2013.01); *H01L 2224/05124* (2013.01); *H01L 2224/05562* (2013.01); *H01L 2224/05573* (2013.01); *H01L 2224/05575* (2013.01); *H01L 2224/05624* (2013.01); *H01L 2224/11318* (2013.01); *H01L 2224/1132* (2013.01); *H01L 2224/11901* (2013.01); *H01L 2224/13007* (2013.01); *H01L 2224/13017* (2013.01); *H01L 2224/1308* (2013.01); *H01L 2224/13083* (2013.01)

(58) Field of Classification Search
CPC . H01L 2224/05575; H01L 2224/05624; H01L 2224/05562; H01L 2224/13007; H01L 2224/11318; H01L 2224/1132; H01L 2224/13017; H01L 2224/03921; H01L 2224/05124; H01L 2224/05573; H01L 2224/05073; H01L 2224/11901; H01L 2224/13083; H01L 2224/0401; H01L 2224/04042; H01L 2224/1308
See application file for complete search history.

(56) References Cited

U.S. PATENT DOCUMENTS

| | | | | |
|---|---|---|---|---|
| 7,446,419 | B1* | 11/2008 | Lin | H01L 21/6835 |
| | | | | 438/106 |
| 10,624,215 | B2* | 4/2020 | Tanaka | H05K 3/323 |
| 2003/0012925 | A1 | 1/2003 | Gorrell | |
| 2004/0200054 | A1 | 10/2004 | Nakagawara | |
| 2007/0216023 | A1* | 9/2007 | Nakatani | H01L 24/11 |
| | | | | 257/714 |
| 2008/0308938 | A1* | 12/2008 | Yu | H01L 24/11 |
| | | | | 257/E23.017 |
| 2009/0091024 | A1* | 4/2009 | Zeng | H01L 24/81 |
| | | | | 257/737 |

FOREIGN PATENT DOCUMENTS

| | | |
|---|---|---|
| CN | 106252247 A | 12/2016 |
| CN | 107527675 A | 12/2017 |
| CN | 107604324 A | 1/2018 |
| CN | 109254430 A | 1/2019 |
| TW | I279890 B | 4/2007 |
| WO | 03009375 A2 | 1/2003 |

* cited by examiner

METHOD FOR FORMING CONDUCTIVE LAYER, AND CONDUCTIVE STRUCTURE AND FORMING METHOD THEREFOR

CROSS-REFERENCE TO RELATED APPLICATIONS

This is a continuation of International Patent Application No. PCT/CN2021/104305 filed on Jul. 2, 2021, which claims priority to Chinese Patent Application No. 202010633735.3 filed on Jul. 2, 2020. The disclosures of these applications are hereby incorporated by reference in their entirety.

BACKGROUND

In semiconductor devices, a conductive layer has the functions of signal transmission and power transmission, etc. In a pre-manufacturing process of semiconductor devices, an electrical test is generally performed on other electrical components in the semiconductor device by means of the conductive layer, so as to ensure that the tested electrical components have preset electrical properties. However, multiple electrical tests can cause damage to the conductive layer, thereby affecting the electrical performance of the conductive layer itself.

SUMMARY

Embodiments of this disclosure relate to a method for forming a conductive layer, and a conductive structure and a method for forming the same.

The embodiments of this disclosure provide a method for forming a conductive layer, including: providing a first conductive film and a solution with a conductive material; coating a surface of the first conductive film with the solution, before performing the coating, a temperature of the first conductive film being lower than an evaporation temperature or a sublimation temperature of the solution; and in a process step of performing the coating or after performing the coating, heating the first conductive film, such that the temperature of the first conductive film is higher than or equal to the evaporation temperature or the sublimation temperature of the solution, and forming a second conductive film covering the surface of the first conductive film, wherein the second conductive film including the conductive material.

The embodiments of this disclosure further provide a method for forming a conductive structure, including: providing a first conductive film and a solution with a conductive material; coating a surface of the first conductive film with the solution, when performing the coating, a temperature of the first conductive film being lower than an evaporation temperature or a sublimation temperature of the solution; and in a process step of performing the coating or after performing the coating, heating the first conductive film, such that the temperature of the first conductive film is higher than the evaporation temperature or the sublimation temperature of the solution, and forming a conductive bump located on the first conductive film, wherein a top surface of the conductive bump being higher than that of the first conductive film.

The embodiments of this disclosure further provide a conductive structure, including: a first conductive film and a conductive bump located on the first conductive film. The sidewall shape of the conductive bump includes a curved surface.

BRIEF DESCRIPTION OF THE DRAWINGS

One or more embodiments are illustrated by using figures that are corresponding thereto in the accompany drawings; and the exemplary descriptions do not constitute a limitation to the embodiments. Unless particularly stated, the figures in the accompany drawings do not constitute a scale limitation.

DETAILED DESCRIPTION

To make the objectives, technical solutions, and advantages of the embodiments of this disclosure clearer, the following further describes the embodiments of this disclosure in detail with reference to the accompanying drawings. However, persons skilled in the art can understand that in the embodiments of this disclosure, in order to make readers better understand this disclosure, many technical details are provided. However, even if there are no these technical details, and variations and modifications that are based on the following embodiments, the technical solutions of this disclosure can also be realized.

Figure 1:
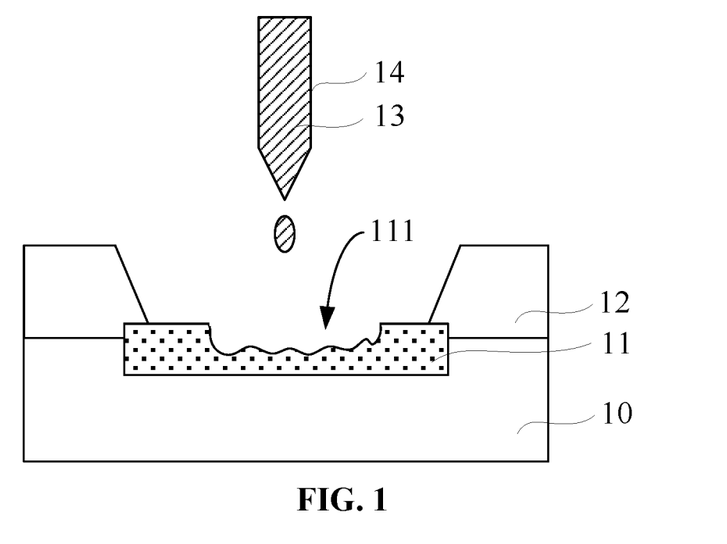
FIG. 1 is a first schematic sectional view corresponding to a step of a method for forming a conductive layer provided in an embodiment of this disclosure.
Figure 2:
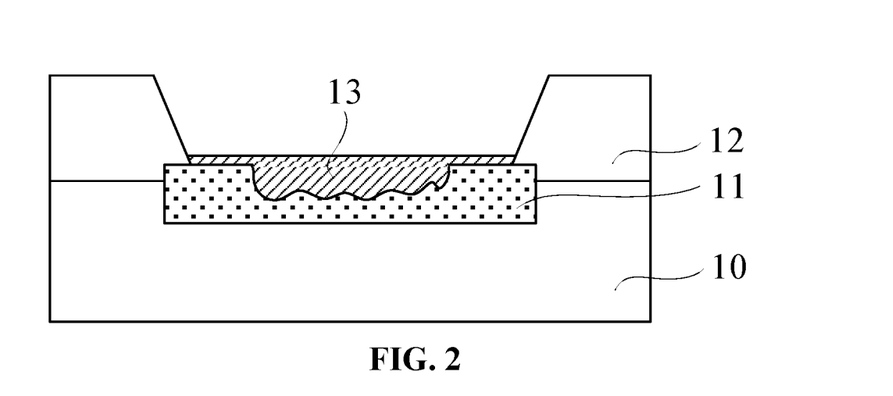
FIG. 2 is a second schematic sectional view corresponding to a step of a method for forming a conductive layer provided in an embodiment of this disclosure.
Figure 3:
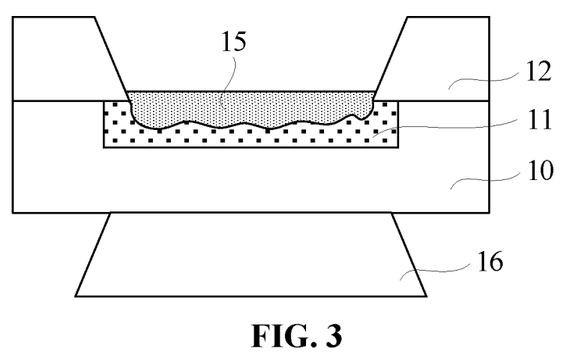
FIG. 3 is a third schematic sectional view corresponding to a step of a method for forming a conductive layer provided in an embodiment of this disclosure.

FIG. 1 to FIG. 3 illustrate schematic sectional views corresponding to the steps of a method for forming a conductive layer provided in an embodiment of this disclosure.

With reference to FIG. 1, a first conductive film 11 and a solution 13 with a conductive material are provided.

In this embodiment, the first conductive film 11 can be a metal pad, for example, a bonding pad, formed in a substrate 10. The metal pad is one of transmission paths for power transmission and control signal transmission. A protective layer 12 is formed on the substrate 10. The protective layer 12 has an opening exposing the surface of the first conductive film 11. The protective layer 12 is configured to protect the substrate 10 and a component located on the surface of the substrate 10. In addition, the protective layer 12 also covers a part of the surface of the first conductive film 11, and serves to fix the first conductive film 11.

In this embodiment, the first conductive film 11 has a damaged surface 111, and the defect of the damaged surface 111 is mainly manifested by multiple grooves with different depth-to-width ratios. The grooves include probe marks formed by improper contact between the probe and the first conductive film 11 during electrical testing. Compared with a groove formed by other damages, for example, a frictional damage, the groove having the probe mark formed by the improper contact of the probe has a large depth-to-width ratio.

In this embodiment, the type of the conductive material in solution 13 is related to a specific requirement. For example, when it is required that a finally formed conductive layer (including the first conductive film 11 and a subsequently formed second conductive film) has good conductive performance, the conductive material has high electrical conductivity. In general, the conductive material is the same as the material of the first conductive film 11, or for a specific requirement, the conductive material is better than the material of the first conductive film 11 in a certain performance.

It should be noted that the conductive material of the solution 13 is not necessarily a single metal material, and can also be multiple metal materials. When the solution 13 has multiple conductive materials, a finally formed second conductive film is in an alloy state.

In this embodiment, the solution 13 can dissolve multiple conductive materials including the material of the first conductive film 11. After being applied to the surface of the first conductive film 11, the solution 13 would first dissolve a part of the material of the first conductive film 11. Therefore, the second conductive film formed by the subsequently precipitated conductive material includes the material of the first conductive film 11.

Because the solution 13 can dissolve the material of the first conductive film 11, the disclosure of the solution 13 is beneficial for reducing the depth-to-width ratio of the grooves in the damaged surface 111, such that the solution 13 is more fully filled in the grooves. Therefore, it is beneficial for reducing seams or voids between the subsequently formed second conductive film and the first conductive film 11, and increasing the contact area between the first conductive film 11 and the second conductive film, thereby improving the bonding strength of the first conductive film 11 and the second conductive film, reducing the electric resistance of the contact surfaces of the first conductive film 11 and the second conductive film, and further making the conductive layer have high structure stability and electrical conductivity.

In addition, because the solution 13 can dissolve the material of the first conductive film 11, an alloy can be formed at a bonding position between the first conductive film 11 and the subsequently formed second conductive film. Therefore, it is beneficial for enhancing the bonding strength of the first conductive film 11 and the second conductive film, and improving the structure stability of the conductive layer.

In this embodiment, the solution 13 includes amalgam. Amalgam (which is mercury) can be formed by dissolving various metals, such as copper, silver, gold, and aluminum. Moreover, various metals in the amalgam can be precipitated by heating amalgam, and the precipitated metals can form an alloy having good adhesion with a metal that is in contact with amalgam.

It should be noted that the conductive material contained in the solution 13 would affect the temperature required for starting the evaporation or sublimation of the solution 13. Therefore, when the first conductive film 11 is heated, it is necessary to adjust the temperature of the first conductive film 11 according to the type of the solution and the conductive material contained, such that the included conductive material can be completely precipitated. In this embodiment, the solution 13 is amalgam, and the temperature of the heated first conductive film 11 should be higher than or equal to 36° C.

In this embodiment, the solution 13 is applied by dropping from a dropper 14. In the process of applying the solution 13, it is merely needed to control the position of the dropper 14 relative to the first conductive film 11, and control the amount of the solution 13 applied each time by controlling the amount of extrusion of the dropper 14, and thus, accurate disclosure can be realized, so as to completely fill in the grooves in the damaged surface 111.

Compared with an existing technique that needs to use a high-temperature process to form a metal melt, the process steps mentioned in this solution can be performed under a low-temperature environment, thereby being beneficial for preventing a high-temperature environment from damaging the first conductive film 11 and neighboring other components, and ensuring that the finally formed conductive layer and the neighboring components have good performance.

In addition, compared with the electroplating process to form the conductive layer, the conductive layer is formed by using a coating process, and no additional sidewalls are formed to limit a metal deposition position during electroplating, and no materials or apparatus for electroplating, such as an electroplating solution, an electroplating groove, and anode are required, which is beneficial to reduce the complexity of the process and reduce a process cost.

With reference to FIG. 2, the surface of the first conductive film 11 is coated with the solution 13, and before performing coating, the temperature of the first conductive film 11 is lower than the evaporation temperature or the sublimation temperature of the solution 13.

Because before performing coating, the temperature of the first conductive film 11 is lower than the evaporation temperature or the sublimation temperature of the solution 13, the solution 13 can freely flow for a period of time after being in contact with the surface of the first conductive film 11, so as to be uniformly distributed on the surface of the first conductive film 11. Therefore, it is beneficial for improving the electrical conductivity uniformity of different positions of the subsequently formed conductive layer, and ensuring that the conductive layer has high performance stability.

In this embodiment, the solution 13 is applied to the damaged surface 111 (FIG. 1). Because the solution 13 has a certain period of time for freely flowing, the solution 13 can be, to some extent or even completely filled in the grooves in the damaged surface 111. Therefore, it is beneficial for reducing or even eliminating the seams or voids between the subsequently formed second conductive film and the first conductive film 11, increasing the contact area between the first conductive film 11 and the second conductive film, reducing the electric resistance of the conductive layer consisting of the first conductive film 11 and the second conductive film, improving the bonding strength of the first conductive film 11 and the second conductive film, and further improving the comprehensive performance of the conductive layer.

In addition, the damaged surface 111 is coated with the solution 13 to eliminate the grooves of the damaged surface 111, and thus, it is beneficial for ensuring that a wire has a high bonding degree with the metal pad during subsequent wire bonding. That is, the wire has high bonding strength with the metal pad, and a bonding surface has low electrical resistance.

It should be noted that the larger the depth-to-width ratio of the groove is, the longer a free flowing period of time required for full filling in the groove is. In this embodiment, the free flowing period of time of the solution 13 can be controlled by controlling a time difference between the disclosure period of time of the solution 13 and the period of time of heating the first conductive film 11 to the evaporation temperature or the sublimation temperature.

With reference to FIG. 3, in the process step of performing coating or after performing coating, the substrate 10 is heated, such that the temperature of the first conductive film 11 is higher than or equal to the evaporation temperature or the sublimation temperature of the solution 13 (FIG. 2), so as to form the second conductive film 15 covering the surface of the first conductive film 11. The material of the second conductive film 15 includes the conductive material included in the solution 13.

It should be noted that the time of the temperature of the first conductive film 11 reaching the evaporation temperature or the sublimation temperature is not equal to the time of starting heating the substrate 10. The time of starting heating the substrate 10 can be in the process of performing the coating process, and can also be before or after performing the coating process.

In this embodiment, the substrate 10 is heated by means of a heating table 16 provided below the substrate 10. Therefore, it is beneficial for ensuring that the first conductive film 11 can be uniformly heated, such that the solution 13 at different positions can be simultaneously evaporated or sublimated, and a part of conductive material that is first precipitated is avoided from blocking the flowing of the remaining solution 13, thereby ensuring that the solution 13 can be uniformly distributed on the surface of the first conductive film 11 and be effectively filled in the grooves of the damaged surface.

In this embodiment, in the process step of heating the first conductive film 11, the temperature of the first conductive film 11 is lower than a melting point of the first conductive film 11. Therefore, it is beneficial for avoiding the solution 13 from mixing with the material of the molten first conductive film 11, ensuring that the solution 13 can be normally evaporated or sublimated, and further ensuring that the finally formed conductive layer has good performance.

In other embodiments, when the flowing of the molten material of the first conductive film does not affect the performance of the conductive layer, or the solution can be evaporated or sublimated well under the condition of mixing, or the material of the solution does not affect the performance of the conductive layer, in the process of heating the first conductive film, the temperature of the first conductive film can be higher than or equal to the melting point of the first conductive film.

In this embodiment, the material of the first conductive film 11 includes aluminum; and in the process step of heating the first conductive film 11, the temperature of the first conductive film 11 is lower than or equal to 400° C. Because aluminum easily deforms due to an external force under a temperature environment greater than 400° C., the temperature of the first conductive film 11 is controlled to be below 400° C., and it is beneficial for avoiding affecting the shape and the structure of the first conductive film 11 in the process of applying the solution 13, and further ensuring that the finally formed conductive layer has good performance.

In this embodiment, the substrate 10 is heated, such that the temperature of the first conductive film 11 is higher than or equal to a melting point of the conductive material in the solution 13. Compared with a solid-state conductive material, a liquid-state conductive material is more easily and uniformly distributed on the surface of the first conductive film 11, and more easily repairs the damaged surface of the first conductive film 11, eliminates the seams or the voids between the second conductive film 15 and the first conductive film 11, and increases the contact area of the second conductive film 15 and the first conductive film 11, thereby improving the bonding strength of the second conductive film 15 and the first conductive film 11, reducing the electric resistance of the conductive layer, and ensuring that the conductive layer has good electrical conductivity and structure stability.

It should be noted that in the process step of heating the first conductive film 11, for the setting of the temperature of the first conductive film 11, it is not only needed to consider the influences of the physical states of different film layers and materials on the performance of the finally formed conductive layer, but also needed to consider the irreversible influence of the temperature on the performance of different materials and different components, for example, along with the rising of the temperature, the performance of some of the components or materials can irreversibly deteriorate, thereby ensuring that the finally formed conductive layer and a device including the conductive layer have good performance.

In this embodiment, the top surface of the second conductive film 15 is higher than that of the first conductive film 11, thereby ensuring that the grooves of the damaged surface are completely filled. In other embodiments, the top surface of the second conductive film is lower than or flush with that of the first conductive film.

In this embodiment, the surface of the first conductive film 11 is coated with the solution 13 by using the coating process, and by controlling the temperature of the first conductive film 11 when performing the coating process, the solution 13 can be uniformly distributed on the surface of the first conductive film 11. A entire process can be completely performed under a low-temperature condition, without using the high-temperature process to dissolve the conductive material, thereby being beneficial for avoiding the high-temperature environment from damaging the conductive layer and other components around the conductive layer.

Accordingly, the embodiments of this disclosure also provide a method for forming a conductive structure.

Detailed descriptions are made below with reference to FIG. 4 to FIG. 9. FIG. 4 to FIG. 9 illustrate schematic sectional views corresponding to the steps of a method for forming a conductive structure provided in an embodiment of this disclosure.

Figure 4:
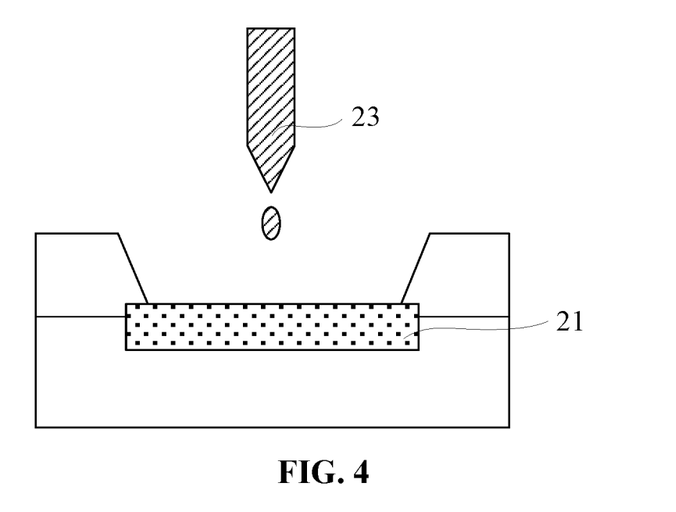
FIG. 4 is a first schematic sectional view corresponding to a step of a method for forming a conductive structure provided in another embodiment of this disclosure.

With reference to FIG. 4, a first conductive film 21 is provided, and the surface of the first conductive film 21 is coated with a solution 23 one time.

In this embodiment, the surface of the first conductive film 21 is not damaged. When a conductive bump can be directly formed on the surface of the first conductive film 21, the conductive bump and the first conductive film 21 can have large contact area. Therefore, the conductive bump has high structure reliability, and the contact surfaces of the conductive bump and the first conductive film 21 have low electrical resistance.

In other embodiments, the first conductive film has a damaged surface, and before forming the conductive bump, it is needed to apply the solution in advance to form a second conductive film that is completely filled in the grooves of the damaged surface. Therefore, it is beneficial for increasing the contact area between the conductive bump and the conductive layer, and further improving the bonding strength of the conductive bump and the conductive layer, and reducing the electrical resistance of the contact surfaces of the conductive bump and the conductive layer.

Figure 5:
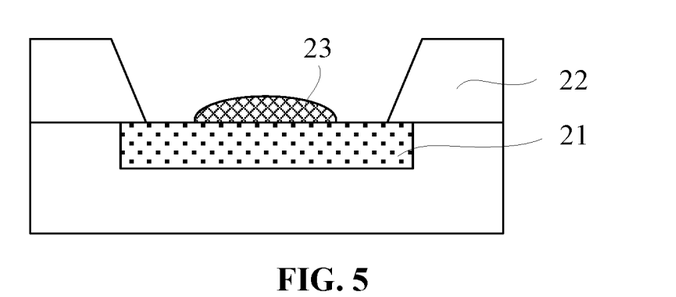
FIG. 5 is a second schematic sectional view corresponding to a step of a method for forming a conductive structure provided in another embodiment of this disclosure.

In this embodiment, with reference to FIG. 5, single coating is performed by using a small amount of solution 23. The top surface of the conductive film formed by means of the single coating is lower than that of a protective layer 22, and it is needed to perform coating multiple times to form the conductive bump having the top surface higher than that of the protective layer 22. By performing the single coating by using a small amount of solution 23, it is beneficial for avoiding the protective layer 22 from blocking the dropping of a large amount of solution, thereby ensuring that the conductive bump is in good contact with the first conductive film 21.

Figure 6:
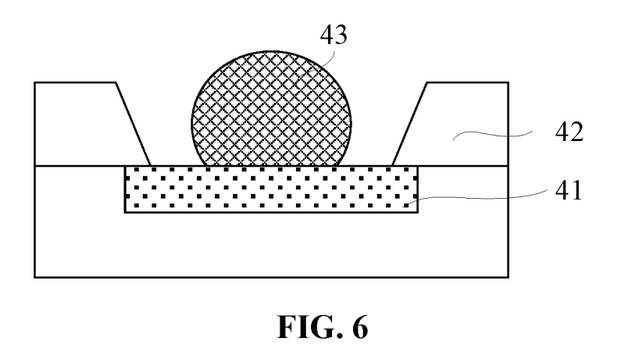
FIG. 6 is a third schematic sectional view corresponding to a step of a method for forming a conductive structure provided in another embodiment of this disclosure.

In other embodiments, with reference to FIG. 6, when the depth-to-width ratio of the opening of the protective layer 42 exposing the first conductive film 41 is small, the single coating can also be performed by using a large amount of solution 43, so as to form, on the surface of the first conductive film 41, the conductive bump that merely includes a single conductive layer. Therefore, it is beneficial for shortening the process period of the conductive bump.

In this embodiment, when the solution 23 is applied, the temperature of the first conductive film 21 is lower than the evaporation temperature or the sublimation temperature of the solution 23. Therefore, after being in contact with the first conductive film 21, the solution 23 can freely flow for a period of time, and further is in full contact with the surface of the first conductive film 21. That is, the solution 23 can have larger contact area with the surface of the first conductive film 21, such that the conductive bump formed of the conductive material subsequently precipitated from the solution 23 has large contact area with the first conductive film 21, and further the conductive bump and the first conductive film 21 have high bonding strength, and the contact surfaces of the conductive bump and the first conductive film 21 have low electrical resistance.

It should be noted that between coating the surface of the first conductive film 21 with the solution 23 and starting evaporating or sublimating the solution 23, the solution 23 is gradually distributed on the surface of the first conductive film 21. That is, a height difference between the top surface of the solution 23 and that of the first conductive film 21 is smaller and smaller, the contact surfaces of the solution 23 and the first conductive film 21 are larger and larger, and the larger the contact surface is, the better the structure stability of the conductive bump is. In an actual disclosure process, it is needed to balance the evaporation or sublimation period of time of the solution 23 and the structure stability of the conductive bump, so as to select a proper evaporation or sublimation period of time. The evaporation or sublimation period of time is a period of time from coating the surface of the first conductive film 21 with the solution 23 to starting curing.

Figure 7:
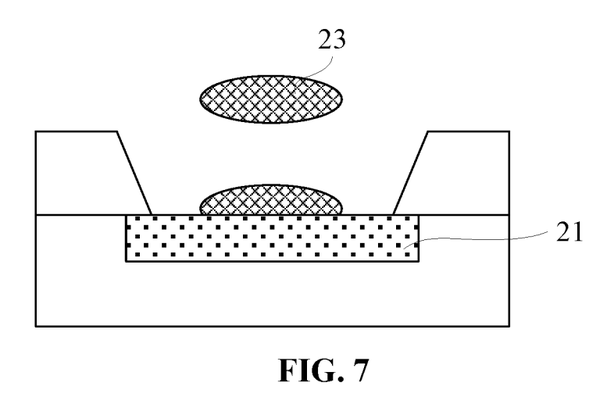
FIG. 7 is a fourth schematic sectional view corresponding to a step of a method for forming a conductive structure provided in another embodiment of this disclosure.
Figure 8:
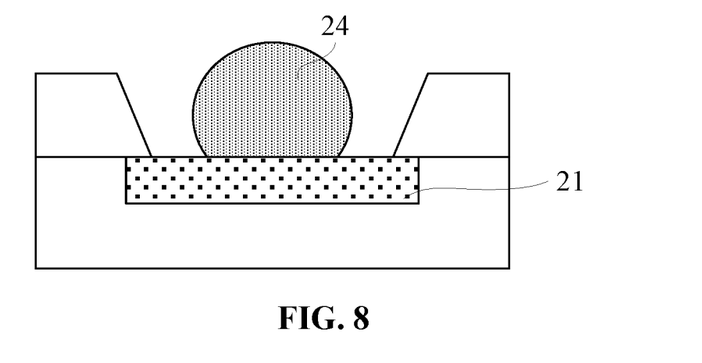
FIG. 8 is a fifth schematic sectional view corresponding to a step of a method for forming a conductive structure provided in another embodiment of this disclosure.

With reference to FIGS. 7 and 8, coating is performed multiple times and the first conductive film 21 is heated to form the conductive bump 24. The top surface of the conductive bump 24 is higher than that of the first conductive film 21.

In this embodiment, because the height of the conductive film obtained by coating the top surface of the first conductive film 21 with the solution 23 one time and heating is lower than a preset height requirement, and the conductive film cannot be directly used as the conductive bump, it is needed to perform coating multiple times, so as to obtain the conductive bump that satisfies the preset height requirement.

In this embodiment, between two adjacent coatings, the temperature of the first conductive film 21 is lower than the evaporation temperature or the sublimation temperature of the solution 23. Therefore, the solution 23 for next coating can be blended with the solution 23 for last coating, and after heating the first conductive film 21 to evaporate or sublimate the solution 23, an integrated conductive bump 24 that merely includes a single conductive film can be formed.

Because the solution 23 that is applied at different times can be blended with each other, the finally formed integrated conductive bump 24 has fewer voids. That is, the conductive bump 24 has good conductive performance.

Figure 9:
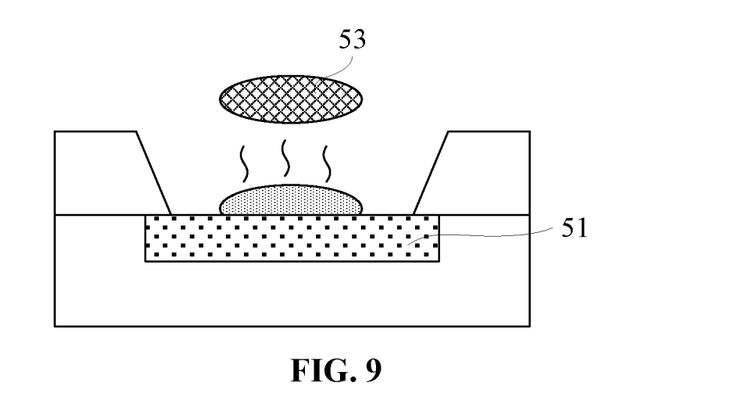
FIG. 9 is a first schematic sectional view corresponding to a step of a method for forming a conductive structure provided in some other embodiments of this disclosure.
Figure 10:
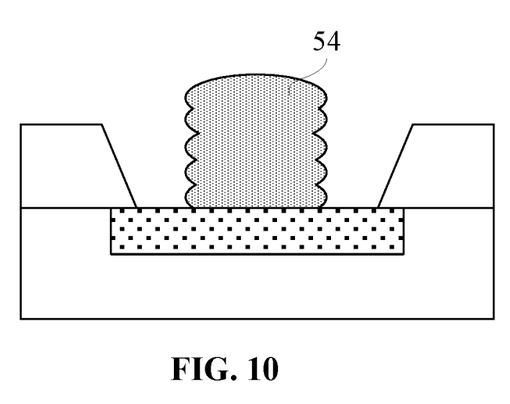
FIG. 10 is a second schematic sectional view corresponding to a step of a method for forming a conductive structure provided in some other embodiments of this disclosure.

In other embodiments, with reference to FIGS. 9 and 10, between two adjacent coatings, the temperature of the first conductive film 51 is higher than or equal to the evaporation temperature or the sublimation temperature of the solution 53. Therefore, the conductive film formed of the conductive material precipitated from the solution 53 can be quickly stacked to reach a preset height, so as to form the conductive bump 54 including multiple layers of conductive films. Therefore, it is beneficial for shortening the process period of the conductive bump 54.

In this embodiment, compared with forming the conductive bump by using an electroplating process, the conductive bump is formed by using a coating process, it is not needed to form an additional sidewall to limit a metal deposition position during electroplating, and is likewise not needed to provide materials or apparatus for electroplating, such as an electroplating solution, an electroplating groove, and anode, and it is merely needed to align and control a coating amount, and perform heating at a proper time, thereby being beneficial for reducing the complexity of the process and reducing a process cost.

Accordingly, the embodiments of this disclosure also provide a conductive structure. The conductive structure is formed by using the described method for forming the conductive structure.

Figure 11:
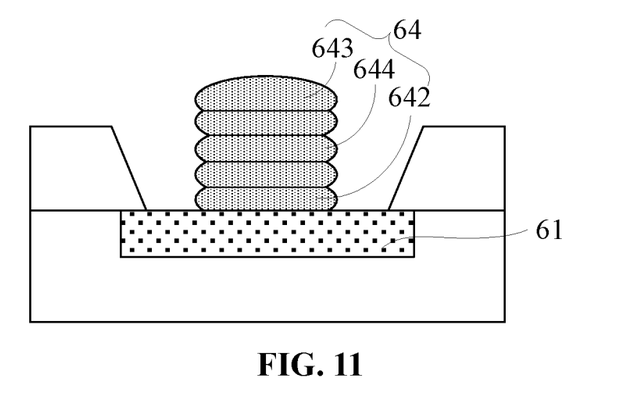
FIG. 11 illustrates a schematic sectional view corresponding to a conductive structure provided in an embodiment of this disclosure.

With reference to FIG. 11, the conductive structure includes a first conductive film 61 and a conductive bump 64 located on the first conductive film 61. The sidewall shape of the conductive bump 64 includes a curved surface.

In this embodiment, the conductive bump 64 includes conductive films stacked in sequence, and the sidewall shape of the conductive bump 64 includes a wave shape. Because the multiple layers of conductive films are always not perfectly attached to each other, and there are a certain number of voids or seams, persons skilled in the art can individually remove one layer of conductive film by means of the voids and the seams. Therefore, when the conductive block 64 is damaged, one or more layers of conductive films located at a top end are merely removed, without removing the entire conductive bump 64. Accordingly, because an undamaged conductive film can be reserved, the repair time of the conductive bump 64 can be shortened, and the service life of the conductive bump 64 can be prolonged.

In this embodiment, the conductive material of different layers of conductive films is identical or different. For example, the conductive bump 64 includes a second conductive film 642 in contact with the first conductive film 61, a third conductive film 643 that is subsequently used as a pressing weld contact point, and a fourth conductive film 644 located in an intermediate region. The connection strength between the second conductive film 642 and the first conductive film 61 is greater than that between the third conductive film 643 and the first conductive film 61. The melting point of the fourth conductive film 644 is lower than that of the third conductive film 643. The electrical conductivity of the fourth conductive film 644 is higher than that of the second conductive film 642 and that of the third conductive film 643. Therefore, it can be ensured that the conductive bump 64 has high connection strength with the first conductive film 61, can also be ensured that the conductive bump 64 has low electrical resistance, and can also ensure that the conductive bump 64 can be in structure connection with a chip and the like at a low temperature.

It should be noted that because the single conductive film can contain multiple conductive materials, when the proportion of one of the materials changes, the property of the conductive film can also be changed accordingly. Therefore, by adjusting the proportion of the same conductive material in each layer of conductive film, different conductive films with the same conductive material composition type present different properties.

This embodiment provides a new conductive structure. The sidewall shape of the conductive bump can be curved. When the performance of the conductive bump is damaged, the conductive bump can be repaired or re-formed by using multiple low-cost process methods, such as coating, thereby helping reduce a maintenance cost.

Persons skilled in the art can understand that the described implementations are specific embodiments of this disclosure, and in actual disclosures, various changes in form and details can be made without departing from the spirit and the scope of this disclosure. Any person skilled in the art can make various changes and modifications without departing from the spirit and the scope of this disclosure. Therefore, the scope of protection of this disclosure should be subject to the scope defined by the claims.

What is claimed is:

1. A method for forming a conductive layer, comprising:
   providing a first conductive film and a solution with a conductive material;
   coating a surface of the first conductive film with the solution, and prior to said coating, a temperature of the first conductive film being lower than an evaporation temperature or a sublimation temperature of the solution; and
   in a process step of performing the coating or after performing the coating, heating the first conductive film, such that the temperature of the first conductive film is higher than or equal to the evaporation temperature or the sublimation temperature of the solution, and forming a second conductive film covering the surface of the first conductive film, the second conductive film comprising the conductive material.

2. The method for forming a conductive layer of claim 1, wherein the first conductive film has a damaged surface; the damaged surface is coated with the solution; and after said coating, the second conductive film covering the damaged surface is formed.

3. The method for forming a conductive layer of claim 1, wherein in a process step of heating the first conductive film, the temperature of the first conductive film is lower than a melting point of the first conductive film.

4. The method for forming a conductive layer of claim 3, wherein a material of the first conductive film comprises aluminum; and in the process step of heating the first conductive film, the temperature of the first conductive film is lower than or equal to 400° C.

5. The method for forming a conductive layer of claim 1, wherein the heating the first conductive film comprises heating the first conductive film, such that the temperature of the first conductive film is higher than or equal to a melting point of the conductive material.

6. The method for forming a conductive layer of claim 1, wherein the solution is capable of dissolving the material of the first conductive film; and the second conductive film comprises the material of the first conductive film.

7. The method for forming a conductive layer of claim 1, wherein the solution comprises amalgam.

8. The method for forming a conductive layer of claim 7, wherein the heating the first conductive film comprises heating the first conductive film, such that the temperature of the first conductive film is higher than or equal to 36° C.

9. A method for forming a conductive structure, comprising:
   providing a first conductive film, and a solution with a conductive material;
   coating a surface of the first conductive film with the solution, wherein when performing the coating, a temperature of the first conductive film is lower than an evaporation temperature or a sublimation temperature of the solution; and
   in a process step of performing the coating or after performing the coating, heating the first conductive film, such that the temperature of the first conductive film is higher than the evaporation temperature or the sublimation temperature of the solution, and forming a conductive bump located on the first conductive film, a top surface of the conductive bump being higher than that of the first conductive film.

10. The method for forming a conductive structure of claim 9, wherein the surface of the first conductive film is coated with the solution multiple times; and between two adjacent coatings, the temperature of the first conductive film is higher than or equal to the evaporation temperature or the sublimation temperature of the solution, so as to form the conductive bump comprising multiple conductive films stacked in sequence.

11. The method for forming a conductive structure of claim 9, wherein the surface of the first conductive film coated with the solution multiple times; and between two adjacent coatings, the temperature of the first conductive film is lower than the evaporation temperature or the sublimation temperature of the solution, so as to form the conductive bump comprising a single layer of a conductive film.

12. The method for forming a conductive structure of claim 9, wherein the solution is applied through dripping from a dropper or screen printing.

13. A conductive structure, comprising:
   a first conductive film; and
   a conductive bump disposed on the first conductive film;
   wherein a sidewall profile of the conductive bump comprises a curved surface, a top surface of the conductive bump is higher than a top surface of the first conductive film; and
   wherein the conductive bump is formed by heating the first conductive film having a surface coated with a solution with a conductive material, a temperature of the coating is lower than a temperature of the heating.

14. The conductive structure of claim 13, wherein the conductive bump comprises a plurality of conductive films stacked in sequence, and the sidewall shape of the conductive bump comprises a wave shape.

15. The conductive structure of claim 14, wherein the plurality of conductive films of different layers have different conductive materials, or a same conductive material in the plurality conductive films of different layers have different portions.

* * * * *